US008268647B2

(12) United States Patent
Westland

(10) Patent No.: US 8,268,647 B2
(45) Date of Patent: Sep. 18, 2012

(54) METHOD OF MANUFACTURING AN INK JET PRINT HEAD

(75) Inventor: Alex N. Westland, Baarlo (NL)

(73) Assignee: Oce-Technologies B.V., Venlo (NL)

( * ) Notice: Subject to any disclaimer, the term of this patent is extended or adjusted under 35 U.S.C. 154(b) by 9 days.

(21) Appl. No.: 13/110,577

(22) Filed: May 18, 2011

(65) Prior Publication Data

US 2011/0217797 A1 Sep. 8, 2011

Related U.S. Application Data

(63) Continuation of application No. PCT/EP2009/066200, filed on Dec. 2, 2009.

(30) Foreign Application Priority Data

Dec. 2, 2008 (EP) .................................... 08170469

(51) Int. Cl.
*H01L 21/301* (2006.01)

(52) U.S. Cl. .......... 438/21; 438/107; 438/462; 438/975; 257/E23.179

(58) Field of Classification Search .................... 438/21, 438/107, 462, 975, FOR. 386; 257/797, 257/E23.179, E21.607
See application file for complete search history.

(56) References Cited

U.S. PATENT DOCUMENTS

| | | | | |
|---|---|---|---|---|
| 4,822,755 | A * | 4/1989 | Hawkins et al. | 438/21 |
| 5,000,811 | A * | 3/1991 | Campanelli | 156/264 |
| 5,068,006 | A * | 11/1991 | Fisher | 216/27 |
| 5,160,403 | A * | 11/1992 | Fisher et al. | 438/21 |
| 5,368,683 | A * | 11/1994 | Altavela et al. | 216/27 |
| 5,620,614 | A * | 4/1997 | Drake et al. | 216/27 |
| 5,719,605 | A | 2/1998 | Anderson et al. | |
| 6,692,113 | B2 | 2/2004 | Silverbrook et al. | |
| 7,673,969 | B2 * | 3/2010 | Hoisington et al. | 347/49 |
| 7,681,985 | B2 * | 3/2010 | Nystrom et al. | 347/42 |
| 7,731,861 | B2 * | 6/2010 | Hashimoto et al. | 216/27 |
| 2002/0086452 | A1 | 7/2002 | Kneezel et al. | |
| 2003/0060024 | A1 | 3/2003 | Imori | |
| 2005/0269289 | A1 * | 12/2005 | Matsuo et al. | 216/27 |
| 2009/0014413 | A1 | 1/2009 | Nystrom et al. | |
| 2012/0129098 | A1 * | 5/2012 | Van Der Heijden et al. | 430/281.1 |

FOREIGN PATENT DOCUMENTS

| | | | |
|---|---|---|---|
| JP | 5-162319 | A | 6/1993 |
| JP | 2007-301886 | A | 11/2007 |
| WO | WO 03/070471 | A | 8/2003 |

OTHER PUBLICATIONS

PCT/ISA/210—International Search Report dated Jan. 22, 2010, PCT/EP2009/066200.

PCT/ISA/237—Written Opinion dated Jan. 22, 2010, PCT/EP2009/066200.

* cited by examiner

*Primary Examiner* — George Fourson, III
(74) *Attorney, Agent, or Firm* — Birch, Stewart, Kolasch & Birch, LLP

(57) ABSTRACT

In a method of manufacturing an ink jet print head that includes a number of aligned modules, an alignment mark is foamed on a first and a second adjacent module, wherein the alignment mark is positioned on a boundary between the first and the second adjacent module along which the wafer is to be separated. In a separating step the wafer is separated into separate modules such that the alignment mark is divided over said first and second adjacent module. At least one of said first and second module is aligned by reference to the divided alignment mark The method improves the accuracy, with which the modules can be aligned.

10 Claims, 2 Drawing Sheets

METHOD OF MANUFACTURING AN INK JET PRINT HEAD

CROSS REFERENCE TO RELATED APPLICATIONS

This application is a Continuation of PCT International Application No. PCT/EP2009/066200 filed on Dec. 2, 2009, which claims priority of Application No. 08170469.4 filed in the European Patent Office on Dec. 2, 2008, all of which are hereby expressly incorporated by reference into the present application.

The invention relates to a method of manufacturing an ink jet print head that comprises a number of aligned modules, wherein a plurality of said modules are formed on a wafer.

U.S. Pat. No. 6,692,113 B2 discloses an ink jet print head wherein semiconductor modules are formed by micro-electromechanical systems (MEMS) each of which forms a plurality of droplet ejecting nozzles and associated drop generating equipment such as ink chambers, actuators and the like. Since the entire nozzle array of the print head is composed of a plurality of such modules, it is necessary for achieving a high quality of the printed images that the modules and hence the nozzles formed thereon are aligned relative to one another with high accuracy.

The MEMS can be formed by means of photo-lithographic techniques from a large wafer which will then be diced to form the individual modules that will then be mounted and aligned on a carrier when the print head is assembled. The modules typically have a rectangular shape, so that their edges can serve as reference in the alignment procedure. This means that the modules will be arranged such that their edges will have a well defined positional relationship.

WO 03/070471 A describes a method of manufacturing an ink jet print head, wherein alignment marks are used for aligning semiconductor chips on a common plate which will then be diced to form print head modules. The nozzles are formed in a separate nozzle plate which is bonded onto the chip and covers the alignment mark formed thereon.

U.S. Pat. No. 5,719,605 describes a method where alignment marks are formed on a metal nozzle plate covering the semiconductor chip.

It is an object of the invention to improve the accuracy, with which the modules can be aligned.

In order to achieve this object, the method according to the invention comprises the steps of:

- forming a plurality of said modules (20) on a wafer (26);
- forming an alignment mark (32) on a first and a second adjacent module (20), wherein the alignment mark (32) is positioned on a boundary (30) between the first and the second adjacent module (20) along which the wafer (26) is to be separated;
- separating the wafer (26) into separate modules (20) such that the alignment mark (32) is divided over said first and second adjacent module (20); and
- aligning at least one of said first and second module (20) by reference to the divided alignment mark (32).

The use of alignment marks is, as such, known in the art of manufacturing and packaging semiconductor devices. There, the alignment marks are used for example for aligning different areas on a wafer with an optical system that is used for projecting a desired pattern of the device onto the wafer. Furthermore the use of alignment marks is known in the art for visually aligning a semiconductor module with a base support. The visual alignment marks are positioned on the outer surface of the module and away from the edge of the module.

In the separating step the wafer is separated into separate modules. The separation step may comprise dicing, cutting, laser cutting or any other way of separating the wafer into separate modules.

In the present invention the alignment mark is positioned on a boundary between the first and the second adjacent module along which the wafer is to be separated. In the separating step the alignment mark is divided over said first and second adjacent module. The part of the divided alignment mark, which remains on the module, is arranged near the edge of the module and may facilitate the alignment of the module. In particular the alignment mark may comprise smooth edges. The edges of the alignment mark may provide reference edges for aligning the module after the separating step of the module. In particular the module may be aligned by physically contacting an edge of the divided alignment mark.

US 2003/0060024 A1 describes a method of manufacturing semiconductor devices, wherein the dicing process is facilitated by etching a grid-like pattern of grooves into the wafer. These grooves will then define the lines along which the wafer is to be diced.

In the present invention, alignment marks are not used in the process of manufacturing or packaging the modules, but they are applied on the individual modules specifically for the purpose of facilitating the alignment of these modules when they are assembled to form an ink jet print head. The divided alignment marks may be used to facilitate a physically alignment of these modules with respect to a physical reference on the print head. The physical reference on the print head may be, for example, a notch.

When the modules are aligned relative to one another by reference to the alignment marks formed on the individual modules, it is possible to achieve an alignment accuracy that is significantly higher than the accuracy achievable with the conventional technique wherein the edges of the modules are used as alignment references. The reason is that the edges of the modules formed by dicing the wafer are not very accurate because the dicing blade is flexible and is subject to wear and to deformations resulting from wear, mechanical strains and thermal influences of a cooling fluid, and the like. All these factors have the effect that the position and shape of the edges of the modules relative to the structures forming the MEMS are not well defined and limit the alignment accuracy. In contrast, when alignment is based on specific alignment marks that may easily be formed on the wafer along with forming the module structures (e.g. by photolithographic techniques), such sources of alignment errors can be avoided, so that the alignment accuracy is improved significantly.

More specific optional features of the invention are indicated in the dependent claims.

An embodiment example will now be described by reference to the drawings, wherein.

Figure 1:
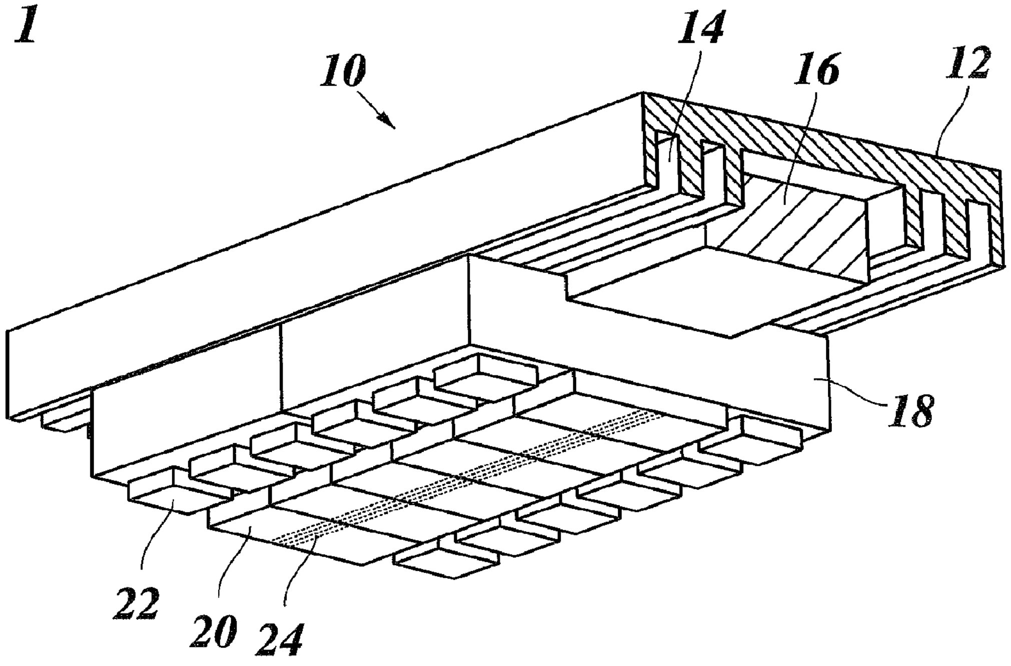
FIG. 1 is a perspective view of a part of an ink jet print head comprising a number of aligned modules.

As is shown in FIG. 1, an ink jet print head 10 comprises a bar-shaped carrier 12 having a plurality of grooves 14 which serve as ink supply ducts. A wider groove 16 accommodates a heating device that is used for heating the ink (e.g. hot melt ink) to its operating temperature.

A number of distribution tiles 18 are mounted on one side of the carrier 12 so as to straddle the heating device 16 and to communicate with each of the ink ducts. On the side opposite to the carrier 12, each distribution tile 18 carries a number of ink discharge modules 20 and electronic drivers 22 for controlling the same.

The ink discharge modules 20 are micro-electromechanical systems (MEMS) and have the form of rectangular chips of, e. g., a semiconductor material such as silicon. Each module 20 has electronic and mechanical micro-structures forming a plurality of nozzles 24. Although not shown in the drawing, each nozzle is connected to an ink chamber by an ink passage, and this ink passage is again connected to a corresponding ink supply line of the distribution title 18. Further, the module forms or accommodates actuators associated with the ink chambers for pressurizing the ink contained therein so as to expel ink droplets from the nozzles 24.

As is known per-se, all these structures are formed in the modules 20 by photo-lithographic techniques in a state, where the modules 20 still form part of a larger silicon wafer.

In the example shown in FIG. 1, the nozzles 24 on each ink discharge module 20 form four parallel rows, one for each of four colors, and the modules 20 are aligned such so that the nozzle rows are continuous all over the plurality of modules 20 and even over the plurality of distribution tiles 18. Further, the modules 20 should be aligned such that the nozzles 24 of each row have a uniform pitch even at the boundary between adjacent modules.

Figure 2:
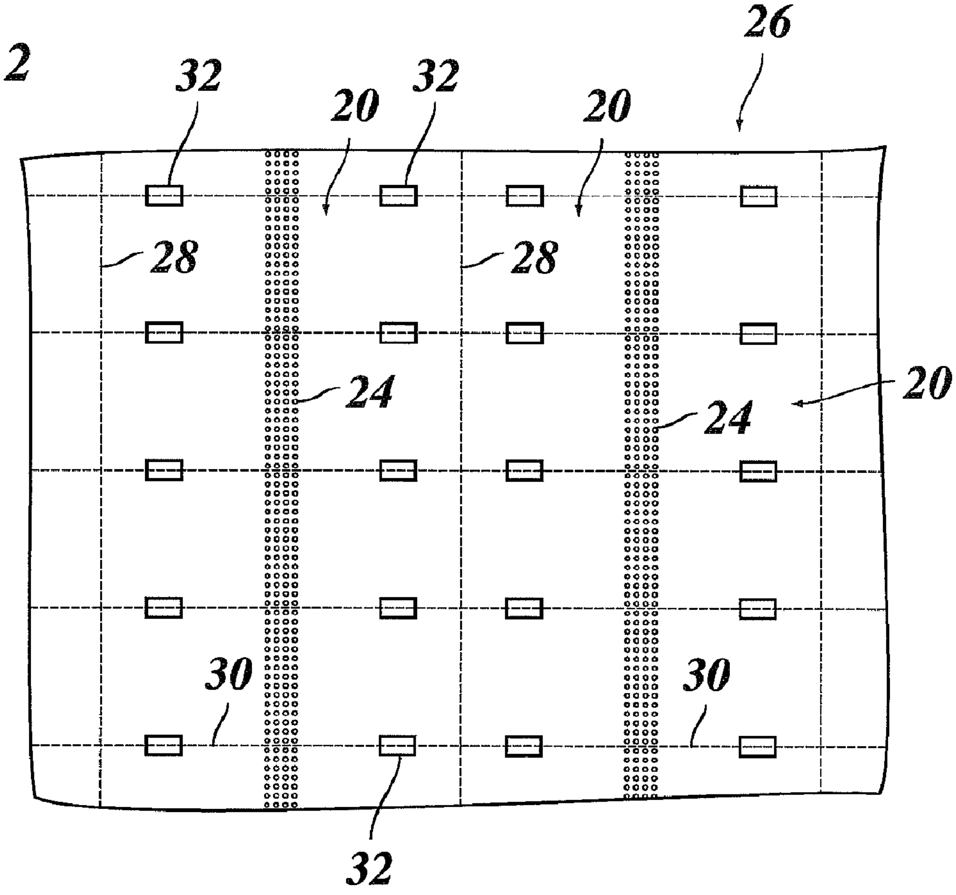
FIG. 2 is a plan view of a part of a wafer on which a plurality of modules is formed.

FIG. 2 shows a part of a wafer 26 from which a large batch of the modules 20 may be formed.

The micro-electromechanical structures formed on and in each module 20 are largely invisible in FIG. 2 and what is visible are only the nozzles 24 that are etched into the silicon material forming the wafer.

Boundaries 28, 30 delimiting the individual modules have been shown as dashed lines in FIG. 2. In a later process stage, the wafer 26 will be diced into the individual modules 20 along these boundaries 28, 30 by means of suitable arrays of dicing blades, as is well known in the art.

As is further shown in FIG. 2, a number of alignment marks 32 have been etched into the wafer 26. These alignment marks 32 are formed by rectangular through-holes that have been etched into the silicon material of the wafer. These rectangular holes are arranged such that they are centered on the horizontal boundaries 30 which will limit the longer edges of the individual modules 20, and two alignment marks 32 per module are provided symmetrically relative to the nozzles 24 on each boundary 30. The rectangular holes forming the alignment marks 32 have their longer sides in parallel with the horizontal boundaries 30, so that their smaller sides are bisected by these boundaries and each half belongs to a different one of two adjacent modules 20. Thus, each module 20 has a total of four alignment marks 32 which, after dicing, have the form of rectangular U-shaped cut-outs in the longitudinal edges of the module.

It will be understood that, in the wafer stage shown in FIG. 2, the alignment marks 32 may be formed (e. g. etched) before, after or concurrently with forming the other structures of the MEMS and with the same exposure equipment, which assures a high positional accuracy of the alignment marks relative to the other structures.

Figure 3:
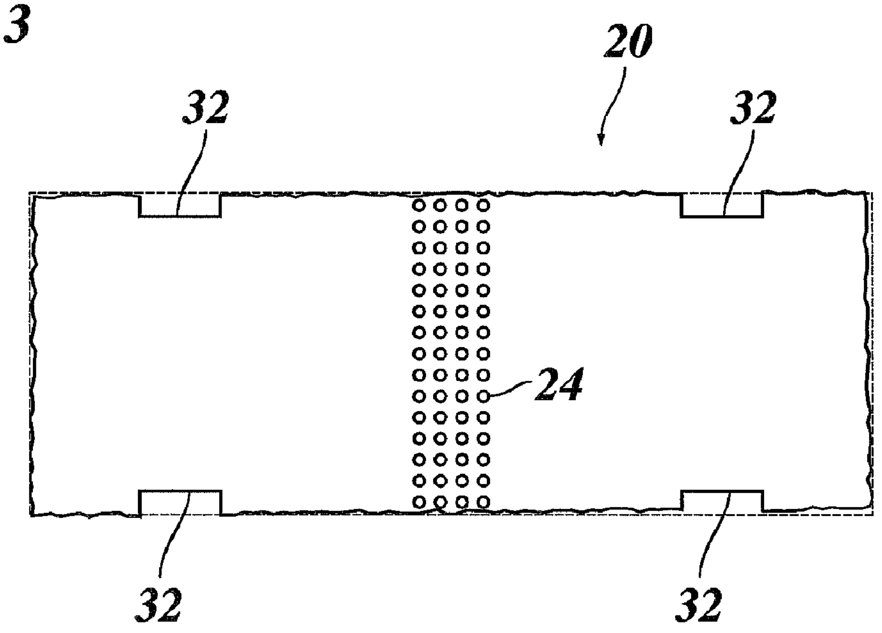
FIG. 3 is an enlarged schematic view of an individual module after dicing.

An individual module 20 with its four alignment marks 32 has been shown on a larger scale in FIG. 3. In this figure, the ideal rectangular shape of the module 20, with correct positions of the edges relative to the nozzles 24, has been indicated by a dashed line, whereas the true edge of the module, resulting from the dicing process, has been shown in continuous lines. As has been shown exaggeratedly in FIG. 3, the true edges of the module 20 deviate from the ideal shape, due to the positional inaccuracies and deformations of the dicing blades. Moreover, the edges look rugged, due to splintering of the cut edges during the dicing process.

As a result, when the true edges of the module 20 were used for aligning the modules relative to one another, as shown in FIG. 1, the resulting alignment accuracy would only be poor. However, the etched alignment marks 32, the positions and shapes of which are well defined relative to the positions of the nozzles 24 provide a reference which permits to align the modules 20 with significantly higher accuracy. The alignment is further facilitated by the fact that the etched holes forming the alignment marks 32 have smooth edges the positions of which can be determined with high accuracy by using, for example, a microscope in combination with an electronic camera and suitable image processing software. The module 20 may be aligned physically facilitated by the three smooth etches of the divided alignment marks 32. The smooth edges of the etched alignment marks 32 facilitate accurate alignment and positioning with respect to a physical reference on the print head (not shown). The physical reference on the print head may be, for example, a notch, a ball or the like. In particular the physical reference may be a ball in contact with a divided alignment mark, the divided alignment mark having a triangular shape after the separating step (not shown).

Figure 4:
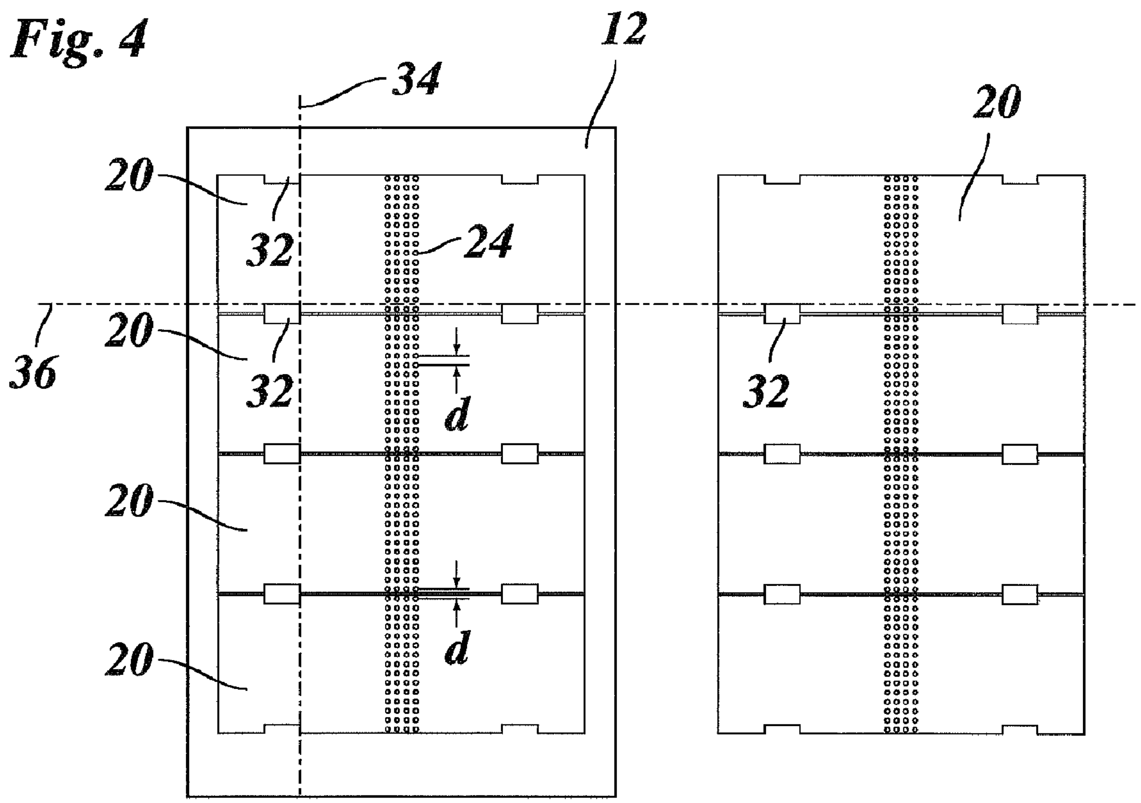
FIG. 4 shows a plurality of modules as aligned in accordance with the invention.

FIG. 4 shows an array of four modules 20 aligned on the carrier 12.

In the alignment process, as is symbolized by a dot-dashed line 34, the shorter sides of the alignment marks 32 are aligned with one another, which assures that the four rows of nozzles 24 of the various modules 20 are exactly aligned with one another.

Moreover, as has been symbolized by another dot-dashed line 36 in FIG. 4, the longer sides of the alignment marks 32 may be used for adjusting the spacings between the individual modules 20 such that, in each nozzle row, the nozzle-to-nozzle distance or pitch d will be uniform not only within an individual module but also between nozzles that belong to different modules (or even different distribution tiles 18).

Some extra modules 20 have been shown in FIG. 4 in order to illustrate, in conjunction with the line 36, that the alignment marks 32, especially the longer sides thereof, may also be used for aligning the modules 20 in a two-dimensional array if this should be required for a specific type of print head.

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. In particular, features presented and described in separate dependent claims may be applied in combination and any combination of such claims are herewith disclosed.

Further, the terms and phrases used herein are not intended to be limiting; but rather, to provide an understandable description of the invention. The terms “a” or “an”, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention claimed is:

1. A method of manufacturing an ink jet print head that comprises a number of aligned modules, comprising the steps of:

forming a plurality of said modules on a wafer;

forming an alignment mark on a first and a second adjacent module, wherein the alignment mark is positioned on a boundary between the first and the second adjacent module along which the wafer is to be separated;

separating the wafer into separate modules such that the alignment mark is divided over said first and second adjacent module; and aligning at least one of said first and second module by reference to the divided alignment mark.

2. The method according to claim 1, wherein the alignment mark is formed on each of the number of aligned modules.

3. The method according to claim 1, wherein the aligning step is by physically contacting at least one of the edges of the divided alignment mark after the separating step.

4. The method according to claim 1, wherein the alignment mark is formed by etching.

5. The method according to claim 1, wherein the alignment mark is formed as through-hole in the wafer.

6. The method according to claim 1, wherein the alignment mark has a rectangular shape.

7. The method according to claim 6, wherein the module has a rectangular shape and the sides of the module are parallel with the sides of the rectangular alignment mark.

8. The method according to claim 7, wherein the alignment mark is formed in the longer edge of the module.

9. The method according to claim 1, wherein each module is formed with four alignment marks and the position of the four alignment marks define corners of a rectangle.

10. The method according to claim 1, wherein the alignment mark is centered on a boundary between the first and the second adjacent module along which the wafer is to be separated.

* * * * *